(12) United States Patent
Clarke et al.

(10) Patent No.: US 6,605,198 B1
(45) Date of Patent: Aug. 12, 2003

(54) APPARATUS FOR, AND METHOD OF, DEPOSITING A FILM ON A SUBSTRATE

(75) Inventors: Peter J. Clarke, Santa Barbara, CA (US); Andrew P. Clarke, Carpinteria, CA (US)

(73) Assignee: Sputtered Films, Inc., Santa Barbara, CA (US)

( * ) Notice: Subject to any disclaimer, the term of this patent is extended or adjusted under 35 U.S.C. 154(b) by 1184 days.

(21) Appl. No.: 08/564,659

(22) Filed: Nov. 29, 1995

Related U.S. Application Data

(63) Continuation of application No. 08/353,100, filed on Dec. 7, 1994, now abandoned, which is a continuation of application No. 08/095,696, filed on Jul. 22, 1993, now abandoned.

(51) Int. Cl.$^7$ .............................................. C23C 14/34
(52) U.S. Cl. ........................... 204/192.22; 204/192.12; 204/192.13; 204/192.15; 204/298.06; 204/298.07; 204/298.08; 204/298.11; 204/298.14; 204/298.18
(58) Field of Search ...................... 204/192.12, 192.13, 204/192.15, 192.22, 298.06, 298.07, 298.08, 298.11, 298.14, 298.18

(56) References Cited

U.S. PATENT DOCUMENTS

| | | | | |
|---|---|---|---|---|
| 4,100,055 A | * | 7/1978 | Rainey .................. 204/298.12 |
| 4,547,279 A | * | 10/1985 | Kiyota et al. ................ 204/298 |
| 4,572,842 A | * | 2/1986 | Dietrich et al. ...... 204/298.7 X |
| 4,849,081 A | * | 7/1989 | Ross ..................... 204/192.15 |
| 4,931,169 A | * | 6/1990 | Scherer et al. ...... 204/298.08 X |
| 4,946,576 A | * | 8/1990 | Dietrich et al. ..... 204/298.08 X |
| 4,957,605 A | * | 9/1990 | Hurwitt et al. ..... 204/298.03 X |
| 4,988,422 A | * | 1/1991 | Wirz ................ 204/298.07 X |
| 5,080,772 A | * | 1/1992 | Hurwitt et al. ..... 204/298.03 X |
| 5,108,569 A | * | 4/1992 | Gilboa et al. ........ 204/298.03 X |
| 5,135,634 A | * | 8/1992 | Clarke ............... 204/298.18 X |
| 5,169,509 A | * | 12/1992 | Latz et al. ............. 204/192.13 |
| 5,223,111 A | * | 6/1993 | Lueft .................... 204/298.07 |

* cited by examiner

*Primary Examiner*—S. H. Versteeg
(74) *Attorney, Agent, or Firm*—Fulwider Patton, et al.; Ellsworth R. Roston

(57) ABSTRACT

An electrical field between a positive anode and a negative target in a cavity and a magnetic field in the cavity cause electrons from the target to ionize neutral gas (e.g. argon) atoms in the cavity. The ions cause the target to release sputtered atoms (e.g. aluminum) for deposition on a substrate. A shield between the target and the substrate inhibits charged particle movement to the substrate. The anode potential may be positive, and the shield and the magnetic members may be grounded, to obtain electron movement to the anode, thereby inhibiting the heating of the shield and the magnetic members by electron impingement. The anode may be water cooled. The magnitude of the positive anode voltage relative to the target voltage provides selectively for (a) a uniform thickness of sputtered atoms on the walls of a groove in the substrate or (b) a filling of the groove by the sputtered atoms and a uniform thickness of deposition on the substrate surface including the filled groove. Progressive differences in the anode-substrate voltage produce progressive increases in the rate of the sputtered atom deposition on the substrate. Oxygen flow into the cavity may be varied through a wide range at a substantially constant anode voltage to produce a deposition of aluminum oxide on the substrate with variations in the refraction index between approximately 1.63–1.70. A selected oxygen flow rate may accordingly produce an acceptable aluminum oxide refraction index in the 1.63–1.70 range, without affecting the anode voltage, even with minor oxygen flow rate variations.

63 Claims, 3 Drawing Sheets

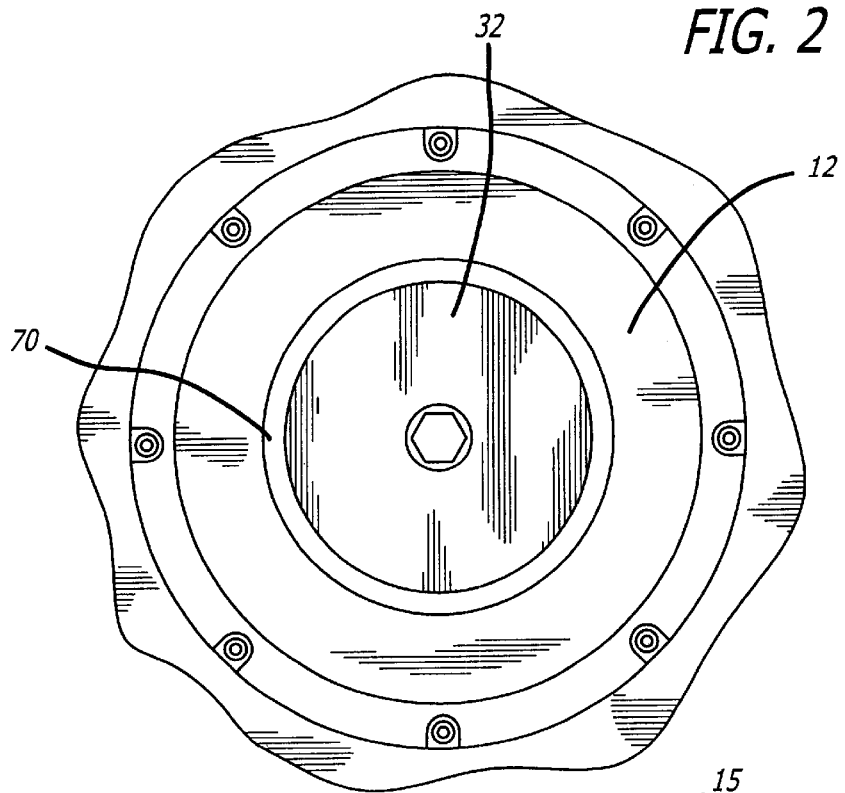
FIG. 2
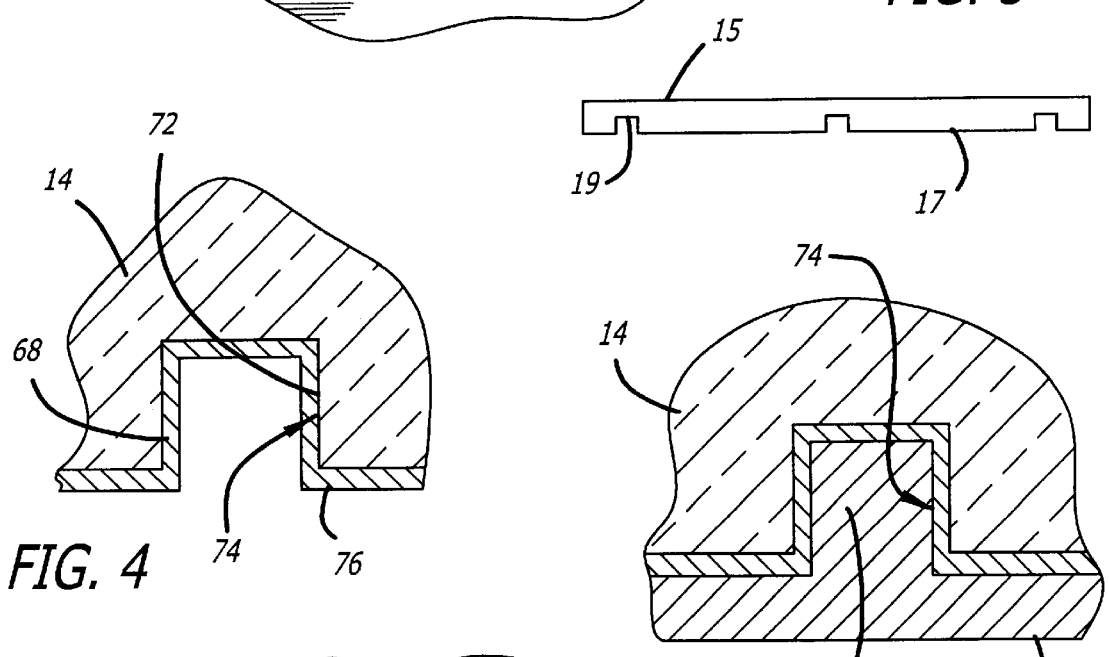
FIG. 3
FIG. 4
FIG. 5
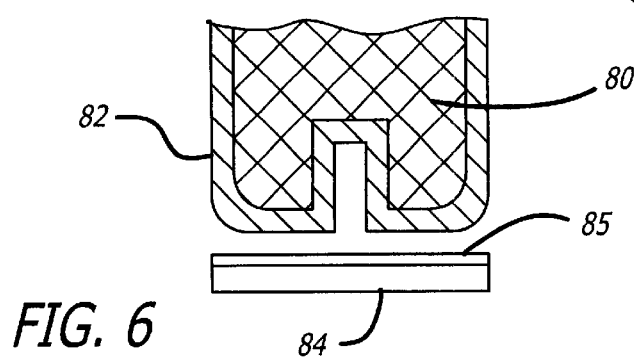
FIG. 6

APPARATUS FOR, AND METHOD OF, DEPOSITING A FILM ON A SUBSTRATE

This is a continuation of application Ser. No. 08/353,100 filed Dec. 7, 1994 now abandoned, which in turn is a continuation of Ser. No. 08/095,696 filed Jul. 22, 1993, now abandoned.

This invention relates to apparatus for, and methods depositing sputtered atoms or molecules on substrates such as wafers for integrated circuit chips or magnetic transducer heads. More particularly, this invention relates to apparatus for, and methods of, controlling the characteristics of the depositions on such substrates.

Wafers are fabricated with a plurality of dies (sometimes as many as hundreds) on each wafer. Each of the dies on a wafer subsequently forms on integrated circuit chip. The dies are tested while on the wafer to determine if they have been produced properly. The defective dies are marked to distinguish them from the satisfactory dies. The dies are then cut from the wafer and the satisfactory dies are retained for use as integrated circuit chips.

The wafers are produced from a plurality of successive layers, some of electrically conductive material and others of electrically insulating material. When a layer of an electrically conductive material is formed, it generally is produced in a pattern to represent electrical circuitry. To produce this electrical circuitry, a layer of an electrically conductive material is initially deposited on the wafer, hopefully in a substantially uniform thickness. The layer is then masked with a material which is subjected to light in a pattern corresponding to the pattern of the electrical circuitry to be produced. The masking material subjected to the light is impervious to an etching material such as an acid.

The remaining portions of the layer are then etched as by an acid. The masking material subjected to the light is then removed from the remaining electrically conductive material in the layer. The electrically conductive material remaining in such layer, and in a plurality of other layers produced in the same manner, defines the electrical circuitry for each die on the wafer.

Apparatus has been in use for some time for depositing sputtered atoms on a wafer to produce a layer of material defined by the sputtered atoms. The apparatus now in use produces such a deposition by producing a glow discharge between an anode and a target in a cavity to obtain an emission of sputtered atoms from the target. A magnetic field co-operates with the electrical field to produce a force on the electrons for enhancing the movement of the electrons in the cavity between the target and the anode to facilitate the ionization of the neutral gas.

For example, when a layer of aluminum is to be deposited on a wafer, the target may be made from aluminum. When the target is bombarded with ions of an inert gas such as argon, the target emits sputtered atoms of aluminum. These atoms travel to the wafer and become deposited on the wafer to produce a substantially uniform layer of electrically conductive material on the wafer such as discussed in the previous paragraph. A water cooled, electrically biased shield may be disposed between the target and the substrate to inhibit charged particles in the cavity from reaching the substrate. These charged particles would otherwise impinge upon the substrate and heat the substrate, thereby causing the quality of the deposition on the substrate to deteriorate.

The apparatus now in use has certain disadvantages in depositing sputtered atoms on a wafer. One disadvantage is that the sputtered atoms are not always deposited in a substantially uniform thickness on the surface of the wafer. A further disadvantage is that the sputtered atoms are not deposited in a substantially uniform thickness on the walls of grooves in such wafer surface. This results from the asymmetrical disposition of the target relative to the walls of such grooves. This disadvantage has existed for some time in spite of the realization during such time of the existence of such disadvantage.

The apparatus now in use also has other disadvantages in depositing sputtered atoms on a wafer. The voltages on the shield and the magnetic members cause these members to attract electrons in the cavity. These electrons impinge on the shield and the magnetic members and heat these members. The shield and the magnetic members also receive depositions of stray sputtered atoms. The heat produced by the electron impingement on the shield and the magnetic members cause the depositions on these members to crack and to generate particles which can destroy electrical circuitry on the wafers.

Similar techniques to those discussed above are used to deposit aluminum oxide on a magnetic transducer head. For example, the sputtered atoms emitted from the target are combined chemically with oxygen introduced at a controlled rate into the cavity. The chemical combination causes aluminum oxide to be produced. The aluminum oxide is deposited on the magnetic transducer head. Aluminum oxide is advantageous because it is an electrical insulator and because it is hard. In this way, if the head should inadvertently contact an information medium such as a storage disc, the head will not be damaged mechanically and will no t be shorted electrically to the medium.

The apparatus used to deposit the aluminum oxide on the transducer head has certain significant disadvantages. One disadvantage is that the oxygen flow rate an d the voltage applied to the target are so critical that any relatively small change in these parameters causes the characteristics of the aluminum oxide deposited on the transducer head to change in an undesirable way. Specifically, the index of refraction of the aluminum oxide decreases to a value where the aluminum oxide becomes relatively soft. This causes the head to become damaged if the head should inadvertently contact the information medium.

In one embodiment of the invention, an electrical field between a positive anode and a negative target in a cavity and a magnetic field in the cavity cause electrons from the target to ionize a neutral gas (e.g. argon) atoms in the cavity. The ions cause the target to release sputtered atoms (e.g. aluminum) for deposition on a substrate. A shield between the target and the substrate inhibits charged particle movement to the substrate.

The anode potential may be positive, and the shield and the magnetic member s may be grounded, to obtain electron movement to the anode, thereby inhibiting the heating of the shield and the magnetic members by electron impingement. The anode may be water cooled. The magnitude of the positive anode voltage relative to the target voltage provides selectively for (a) a uniform thickness of sputtered atoms on the walls of a groove in the substrate or (b) a filling of the groove by the sputtered atoms and a uniform thickness of deposition on the substrate surface including the filled groove. Progressive differences in the anode-substrate voltage produce progressive increases in the rate at which the groove is filled by the sputtered atoms, and a uniform thickness of deposition is produced on the substrate surface including the filled groove.

Oxygen may be introduced into the cavity to combine reactively with the aluminum atoms and produce aluminum oxide. The oxygen flow into the cavity may be varied through a wide range at a substantially constant anode voltage to vary the refraction index between approximately 1.63–1.70 of the aluminum oxide deposited on the substrate. The oxygen flow rate may accordingly be selected to produce an acceptable aluminum oxide refraction index in the 1.63–1.70 range, without affecting the anode voltage, even with flow rate variations.

In the Drawings:

FIG. 2 is a top plan view of the embodiment shown in FIG. 1;

FIG. 3 is an enlarged elevational view schematically illustrating a substrate, and the grooves in a surface of the substrate, receiving the deposition of the sputtered atoms; and FIG. 4 illustrates a groove in a substrate and a deposition of a substantially uniform thickness on the walls of the groove and on the substrate by apparatus constituting an embodiment of the invention;

FIG. 5 illustrates a groove in a substrate and a deposition to fill the substrate and to provide a substantially uniform thickness on the substrate and the area including the groove, this deposition being provided by apparatus constituting another embodiment of the invention;

FIG. 6 is a schematic illustration in perspective of a magnetic head for receiving a deposition of an insulating material such as aluminum oxide and also shows a disc in contiguous relationship to the head;

Figure 8:
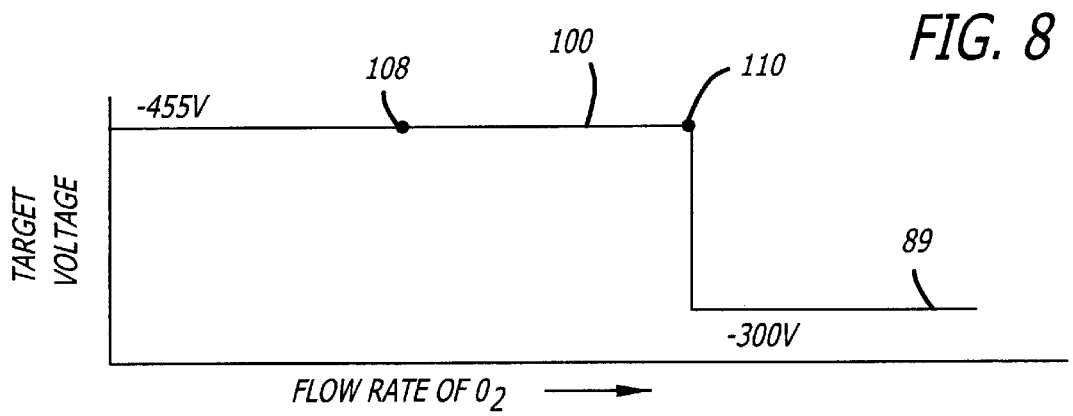
Figure 9:
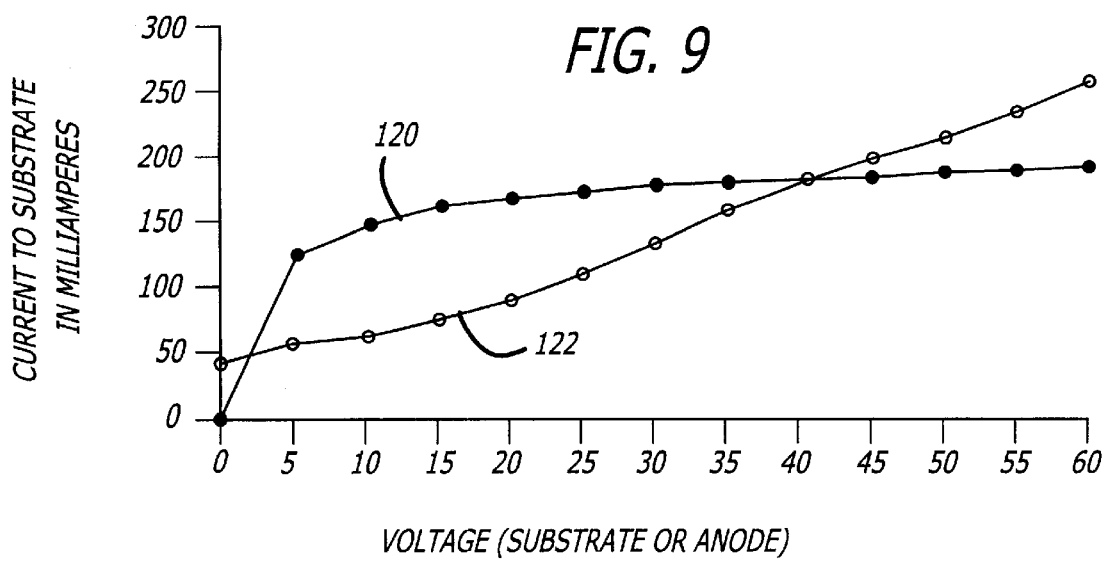

FIG. 8 is a curve illustrating a second relationship between the flow rate of oxygen and the voltage on the target when the anode and the target have a second voltage relationship; and FIG. 9 shows curves illustrating (a) current to the substrate for progressive values of voltage on the substrate and (b) current to the substrate for progressive voltage differences between the anode and the substrate.

Figure 1:
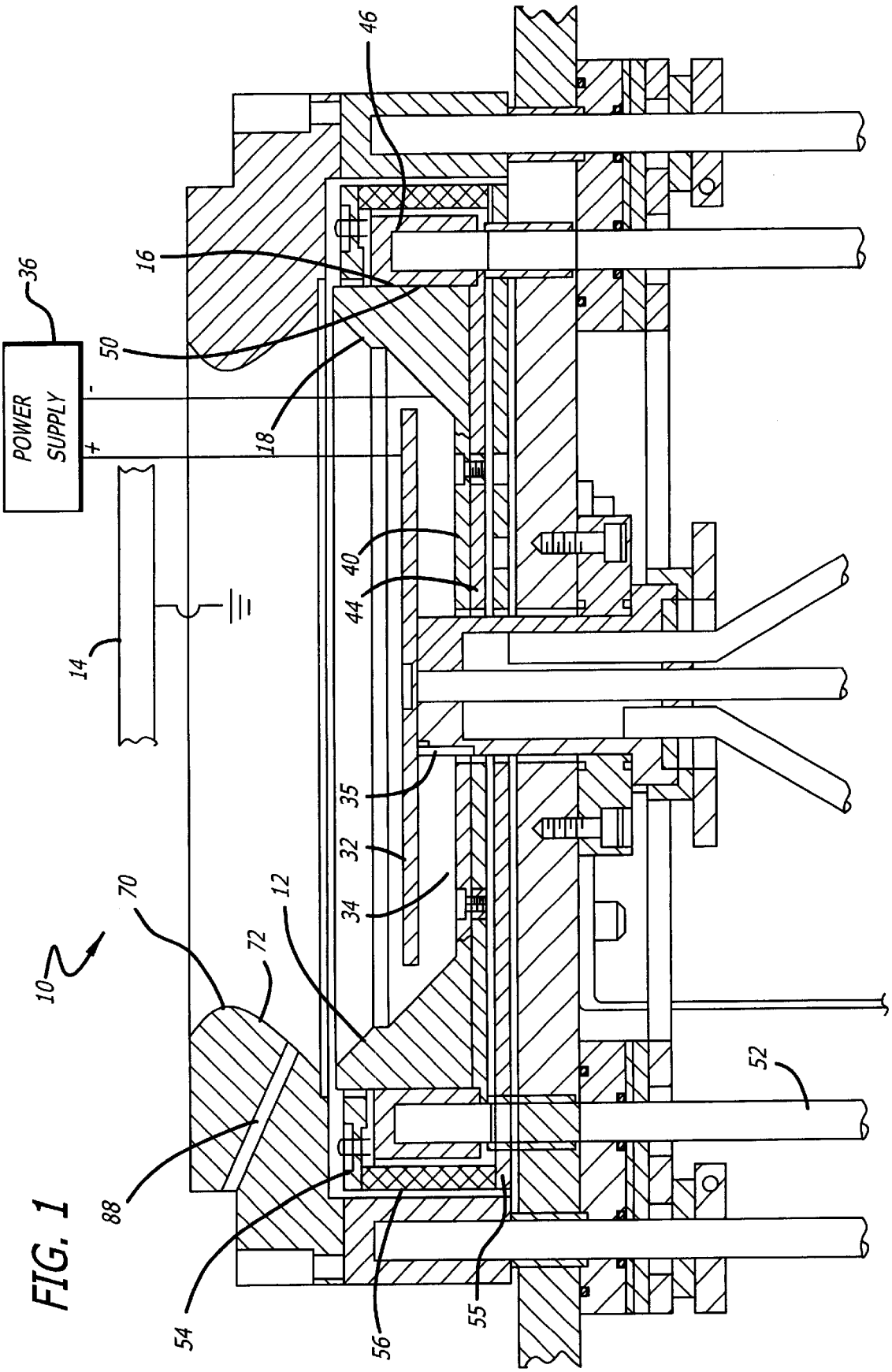
FIG. 1 is a fragmentary sectional view, in side elevation, of apparatus constituting one embodiment of the invention for depositing sputtered atoms of a material from a target on a surface of a substrate such as a wafer and on the walls of grooves in such surface.

In one embodiment of the invention, apparatus generally indicated at 10 in FIG. 1 is provided for depositing sputtered atoms from a target 12 onto a substrate 14. As one alternative, the substrate may constitute a wafer 14 which is used in the semiconductor industry. The wafer 14 may be disposed at a ground potential. The wafer 14 may be in the form of a thin disc made from a suitable material such as silicon and having a suitable diameter such as approximately five inches (5"). The wafer may hold a plurality of dies, each of generally identical construction and each forming, when completed, an integrated circuit chip defining complex electrical circuitry. Each die 15 (FIG. 3) may be quite small (e.g. ¼×¼) so that a considerable number of dies can be formed on a single wafer. Each die 15 may be provided with a surface 17 for receiving a uniform deposition of sputtered atoms and may be further provided with grooves 19 in such surface. The walls of the grooves 19 are also expected to receive a deposition of the sputtered atoms. In many instances, the deposition of the sputtered atoms on the walls of the grooves 19 is expected to be in a substantially uniform thickness.

The target 12 may be a unitary member, preferably with an annular configuration, as shown in FIGS. 1 and 2. The target 12 may be de fined by an annular external periphery 16 and may be provided with a centrally disposed opening defining a frusto-conical internal periphery 18. The internal periphery 18 of the target 12 may have a frusto-conical configuration. The target 12 may be made from a suitable material such as aluminum or titanium.

An anode 32 is disposed internally relative to the target 12 and may be supported in any suitable manner well known in the art. A chamber or cavity 34 is defined in part by the target 12. The cavity 34 holds atoms of an inert gas such as argon. The atoms of the inert gas such as argon are introduced to the cavity 34 through an inlet 35. An electrical field is provided between the anode 32 and the target 12 by connecting the anode and the targets respectively to the positive and negative terminals of a power supply 36. The anode 32 may be at ground potential or some suitable voltage above ground.

A clamp 40 is disposed in the central opening of the target 12 in abutting relationship with the internal periphery 18 of the target. The clamp 40 has a shoulder which overlays the internal periphery 18 of the target 12. The clamp 40 may be made from a suitable material such as copper. The clamp 40 is disposed against a support portion 44 of a cooling member 46 and is attached to the support portion of the cooling member as by screws. The construction of the clamp and the associated member such as the cooling member 46 is fully disclosed in co-pending application Ser. No. 441,642 filed in the United States Patent Office on Nov. 27, 1989, for "Apparatus for Depositing a Thin Layer of Gaseous Molecules on a Member" and assigned of record to the assignee of record of this application.

The cooling member 46 has a portion 50 which abuts the external periphery 16 of the target 12. A passageway 52 is respectively disposed in the cooling member 46 and externally of the cooling member to provide for the flow of a fluid such as water to cool the clamp 40 and the target 12. A pair of magnetizable members 54 and 55 enclosing a permanent magnet 56 are disposed on opposite sides of the target 12 to create a magnetic field in the cavity 34. The magnetizable members 54 and 55 and the permanent magnet 56 may be at a ground potential.

The voltage difference between the anode 32 and the target 12 causes electrons from the discharge to travel toward the anode. The electrons move in a spiral path from the target 12 toward the anode 32 because the magnetic field produced in the cavity or chamber 34 by the permanent magnet 56 and the magnetizable members 54 and 55 has a component in a direction perpendicular to the electrical field between the anode and the target. Because of this spiral path, the electrons have an ample opportunity to strike and ionize argon atoms in the cavity or chamber 34.

The argon ions travel to the frusto-conical internal periphery 18 of the target 12 and cause sputtered atoms to be released from this surface when they impinge on such surface. The sputtered atoms travel to the wafer 14 and become deposited on the wafer. As the gaseous material becomes depleted from the frusto-conical surface 20 of the target 12, the target becomes progressively worn. When the target 12 has become sufficiently worn, the target 12 is removed from the apparatus and is replaced by a new target.

As the sputtered atoms become released from the frusto-conical surface of the target 12, the target becomes heated. This would tend to cause the target to expand at its external periphery 16 in FIG. 1 because of metal expansion caused by heat. However, the external periphery 16 of the target 12 is maintained in fixed position by its mechanical abutment with the portion 50 of the cooling member 46 and by the cooling action of the cooling member. This cooling action results from the flow of a cooling fluid such as water through the passageway 52.

A shield 70 made from a suitable material such as aluminum is disposed between the target 12 and the wafer 14. The shield 70 is provided with a hollow interior 72 having a suitable configuration such as a frusto-conical configuration defining a funnel with progressive positions toward the wafer 14. The shield 70 may be provided with a suitable potential such as a ground potential.

Because of its ground potential, the shield 70 attracts electrons and negative ions in the space between the target 12 and the wafer 14. Since the charged particles create heat when they impinge upon the wafer 14, the inhibition provided by the shield 70 against the movement of the charged particles to the wafer 14 causes the wafer to be maintained at a relatively cool temperature relative to the temperature of wafers in apparatus of the prior art. This allows the wafer 14 to be disposed closer to the target 12 than in the apparatus of the prior art.

By disposing the wafer 14 relatively close to the target 12, the sputtered atoms from the target can be deposited on the wafer 14 with a greater density than in the apparatus of the prior art. Furthermore, the sputtered atoms can be deposited on the wafer 14 with an enhanced uniformity of thickness relative to the deposition of the sputtered atoms on the wafer by the apparatus of the prior art.

The provision of a positive voltage on the anode 32 and of ground potentials on the magnetizable members 54 and 55, the permanent magnet 56, the shield 70 and the wafer 14 provides certain important advantages. It causes the anode 32 to receive the electrons in the cavity rather than the magnetizable members 54 and 55, the permanent magnet 56, the shield 70 and the wafer 14. This prevents the magnetizable members 54 and 55, the permanent magnet 56, the shield 70 and the wafer 14 from being excessively heated. This is significant because no cooling action is provided on the shield 70 or on the wafer 14.

Significant advantages are obtained by considerably increasing the difference in the voltage between the target 12 and the anode 32. For example, the voltage difference between the target 12 and the anode 32 may be as much as five hundred volts (500V.). In this relationship, the voltage on the anode 32 may be varied to affect the characteristics of the deposition on the wafer 14.

For example, when the positive potential on the anode 32 is approximately forty five volts (45V.) and the negative potential on the target 12 is approximately four hundred and fifty five volts (−455V.), a deposition 68 of a substantially constant thickness is made on the walls 72 of a groove 74 in the wafer 14 as illustrated schematically in FIG. 4. A deposition of substantially uniform thickness is also provided on the smooth surface of the wafer 14 as illustrated schematically at 76 in FIG. 4. This is advantageous because it has been difficult, if not impossible, to provide a deposition of a uniform thickness on the walls of a groove, such as the groove 74, in the prior art by using a single target.

Alternatively, when the anode 32 is at a high positive potential of approximately two hundred volts (+200) and the target is at a negative potential of approximately three hundred volts (−300V.), a deposition 78 tends to fill the groove 74 and to provide a substantially smooth surface 79 of the wafer and in the area formerly occupied by the groove 74. This is indicated schematically in FIG. 5. It has been difficult, if not impossible, to accomplish this in the prior art.

The operations described above are not fully understood. However, it is known that a glow discharge of charged particles accumulates near the target 12. This glow discharge may be produced in part from charged particles of argon when the argon is ionized by the electrons from the glow discharge. This glow discharge has a potential approaching that of the anode 32. For example, when the target 12 is at a negative potential of five hundred volts (−500V.) and the anode 32 is at substantially a ground potential, the glow discharge may be at a negative potential of approximately two volts (−2V.). Similarly, the glow discharge may be at a potential close to approximately one hundred volts when the anode 32 is at a positive potential of approximately one hundred volts (+100V.) and the target 12 is at a negative potential of four hundred volts (−400V.).

The negative ions formed in the glow discharge are attracted toward the wafer 14. The potential of the glow discharge is dependent upon the voltage on the anode. The potential difference between the glow discharge and the wafer 14 affects the characteristics of the deposition on the walls 72 of the groove 74 in the wafer 14 and on the smooth surface 76 of the wafer 14 as discussed in the previous paragraph.

Sometimes the substrate may be a transducer such as a magnetic head 80 (FIG. 6). The magnetic head 80 may have a coating 82 of an insulating material such as aluminum oxide ($Al_2O_3$) on its external surface. Aluminum oxide is advantageous because it is hard when it has an index of refraction of at least approximately 1.63. It is important for the aluminum oxide to have an index of refraction of at least 1.63 because the magnetic head 80 is disposed in contiguous relationship to a storage medium such as the surface of a disc 84 with a magnetic coating 85 on its periphery. This contiguous relationship may involve a separation of only a few thousandths of an inch between the magnetic head 80 and the magnetic surface 85 of the disc 84 in order to insure that an optimal transducing action of information will be provided between the head 80 and the magnetic surface 85.

The disc 84 is rotated at a high rate of speed relative to the head 80 to provide the different positions on the head quickly to the head 80 for the transducing action. At this high rate of speed, any tendency for the disc 86 to wobble may cause the head 84 to contact the disc with a high force. The deposition of the aluminum oxide on the external surface of the head 80 with an index of refraction of at least 1.63 prevents the head from being damaged. It also prevents any electrical continuity from being established between the head 80 and the disc 84. As will be appreciated, such an electrical continuity would cause signals to be produced which would create errors in any data processing being performed in a system incorporating the head 80 and the disc 84.

Systems have been provided in the prior art for depositing aluminum oxide ($Al_2O_3$) on the surface of a substrate such as the magnetic head 80. These systems have involved deposition apparatus similar to that shown in FIG. 1 and described above. In these systems, oxygen has been introduced into the cavity 34 as through a conduit 88. The oxygen has combined chemically with the sputtered atoms of aluminum emitted by the target 12 and travelling to the magnetic head. Aluminum oxide has been produced by this chemical reaction. The index of refraction of the aluminum oxide deposited on the head 80 has been approximately 1.63. Alternatively, the oxygen has been introduced into the cavity 34 through the conduit 35. Argon and oxygen can be introduced simultaneously into the cavity 34 through the conduit 35 because they do not combine chemically.

Figure 7:
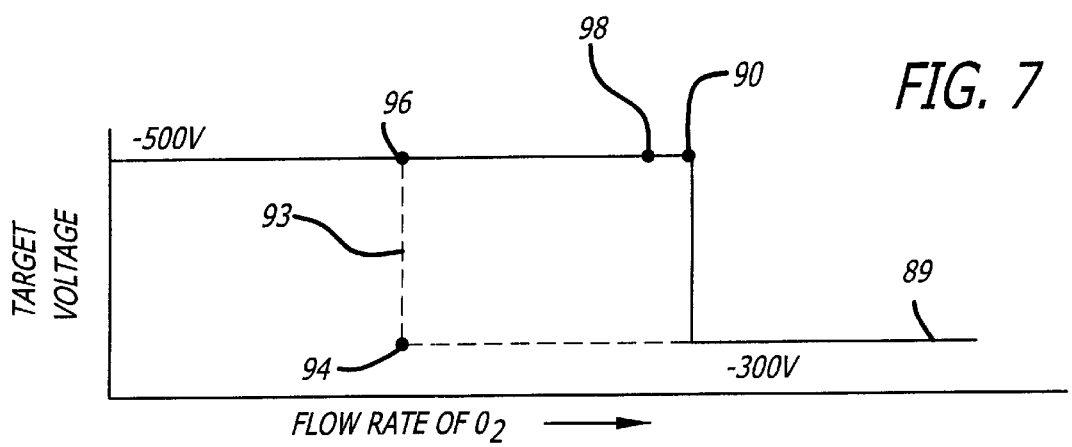
FIG. 7 is a curve illustrating a first relationship between the flow rate of oxygen and the voltage on the target when the anode and the target have a first voltage relationship.

A negative voltage of approximately five hundred volts (−500V.) may be applied to the target 12 as in one embodiment of the invention to obtain a deposition of aluminum oxide on the surface of the magnetic head 80. When this voltage is applied to the target 12, a relationship between the flow rate of the oxygen into the cavity 34 and the voltage on the target 12 is produced. This relationship is shown in FIG. 7. As will be seen, the voltage on the target 12 remains substantially constant as the flow rate of the oxygen into the cavity 34 increases. However, the index of refraction of the aluminum oxide deposited on the magnetic head 80 varies with variations in the flow rate.

As will be seen at 89 in FIG. 7, the voltage on the cathode decreases precipitously to a negative value of approximately three hundred volts (−300V.) when the flow rate of the oxygen increases above a particular value indicated at 90 in FIG. 4. When this occurs, a hysteresis curve is established which is indicated by broken lines 93 in FIG. 7. In accordance with this hysteresis curve, the flow rate of the oxygen into the cavity 34 has to decrease to a value indicated at 94 before the voltage on the target 12 can be restored to a negative value of approximately five hundred volts. The value 94 for the flow rate of the oxygen is considerably below the optimal value 90 for the flow rate. At the flow rate 94, the index of refraction of the aluminum oxide deposited on the head 80 is less than approximately 1.63.

At a flow rate value indicated at 96 in FIG. 7 when the hysteresis curve 93 has been restored to a negative voltage of five hundred volts on the target 12, the index of refraction of the aluminum oxide deposited on the magnetic head 80 is significantly below 1.63. This causes the aluminum oxide deposited on the magnetic head 80 to be relatively soft. A deposition with soft characteristics does not properly protect the magnetic head 80 if and when the disc 84 should crash into the head.

It is only when the flow rate of the oxygen into the cavity 34 reaches an optimal value indicated at 98 that the index of refraction of the aluminum oxide deposited on the magnetic head 80 reaches a value of 1.63. However, the value 98 is so close to the value 90 that an unstable situation exists. In other words, a slight increase in the flow rate of the oxygen into the cavity 34 causes the voltage on the target 12 to decrease to a negative value of approximately three hundred volts (indicated at 89 in FIG. 7), thereby producing a decrease in the index of refraction of the aluminum oxide deposited on the magnetic head 80.

Applicant provides a system which overcomes the disadvantages described above when aluminum oxide is deposited on the surface of the magnetic head 80. In applicant's system, a positive voltage of approximately forty five volts (+45V.) is applied to the anode 32 and a negative voltage of approximately four hundred and fifty five volts (−455V.) is applied to the target 12. This causes a relationship illustrated at 100 in FIG. 8 to be provided. In this relationship, the voltage on the target 12 is shown on the vertical axis and the flow rate of the oxygen into the cavity 34 is shown on the horizontal axis.

In applicant's system, the flow rate of the oxygen into the cavity 34 occurs at a value indicated at 108 in FIG. 8. This flow rate is considerably below the value at which the voltage on the target 12 drops precipitously below a negative value of four hundred and fifty five volts (−455V.). As a result, any minor variations in the flow rate of the oxygen into the cavity 34 from the value 108 will not affect the voltage on the target 12.

Furthermore, at the flow rate value 108, the aluminum oxide deposited on the magnetic head 80 has an index of refraction of approximately 1.63. This index of refraction is also provided at oxygen flow rates above the value 108 through rates considerably above the value 108. At a flow rate 110 considerably above the value 108, the voltage on the cathode decreases precipitously below a negative value of approximately four hundred and fifty five volts. However, this flow rate is so far above the flow rate 108 that the flow rate can be easily regulated to prevent the flow rate 110 from occurring.

At oxygen flow rates reasonably below the value 108, the index of refraction of the aluminum oxide deposited on the magnetic head 80 actually increases above a value of 1.63. Specifically, for decreasing flow rates below the value 108, the index of refraction of the aluminum oxide deposited on the magnetic head 80 may increase to a value as high as 1.70. This is the index of refraction of sapphire which is known to be quite hard.

There are other advantages in a system providing a positive potential on the anode 32 relative to the voltage on a substrate such as the wafer 14. This may be seen from the curves schematically shown in FIG. 9. In FIG. 9, a curve 120 illustrates the relationship between changes in voltage on the substrate such as the wafer 14 relative to the current flowing to the wafer in milliamperes. The curve 120 in FIG. 9 indicates that the current flow to the substrate 14 becomes substantially saturated when the negative voltage on the substrate 14 reaches a relatively low negative value such as approximately five volts (−5V.).

A curve 122 in FIG. 9 indicates the relationship between the voltage on the anode 32 (shown on the horizontal axis) and the current flowing to the substrate 14 (or the head 80) in milliamperes (shown on the vertical axis). In the curve 122 shown in FIG. 9, the voltage on the horizontal axis is shown relative to a ground potential on the substrate 14.

As will be seen in FIG. 9, the current flowing to the substrate 12 continues to increase for anode voltages considerably in excess of five volts (5V.). Such measurements have been made to anode voltages of approximately sixty volts (+60V.). This relationship is further advantageous in that it is substantially linear in the range to approximately sixty volts (+60V.) in the potential on the anode 32. The curve 122 shows a space charge limited current with no indication of saturation.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

What is claimed is:

1. An apparatus for providing a deposition on a planar substrate, including,
    a planar anode disposed in displaced and substantially parallel relationship to the substrate,
    a target spaced from the anode to serve as a cathode, the target having properties of emitting sputtered atoms when bombarded by gaseous ions and of directing the sputtered atoms to the substrate, the target having a hollow substantially frusto-conical configuration with an axis substantially perpendicular to the anode and the substrate,
    first means for defining a cavity between the anode and the target for receiving atoms of an inert gas,
    means for introducing the inert gas into the cavity,
    second means for applying a positive voltage to the anode and a negative voltage to the target relative to the positive voltage on the anode to establish a flow of electrons from the target toward the anode and a glow discharge between the target and the anode to ionize atoms of the inert gas in the cavity, and third means disposed relative to the anode and the target for providing a movement of the electrons between the target and the anode through other than a straight line path to enhance the ionization of the atoms of the inert gas and the emission of the sputtered atoms from the target for movement toward the substrate, the third means being at a potential lower than the positive voltage on the anode, the voltage between the anode and the target having a magnitude, and the positive voltage on the anode having a magnitude, to obtain depositions of the sputtered atoms from the target on the substrate with particular characteristics dependent upon the magnitude of the anode voltage and the difference between the anode voltage and the target voltage, the anode, the gas-introducing means, the first means, the second means and the third means being disposed relative to the target and the substrate to provide for the flow of the sputtered atoms from the target to the substrate without any obstruction, there being in the substrate a groove defined by walls, and a shield disposed between the anode and the substrate without obstructing the flow of sputtered atoms from the target to the substrate and operative at a potential less than the positive voltage on the anode to receive charged particles moving toward the substrate, there being a positive voltage on the anode with a magnitude, and there being a voltage difference between the anode and the target with a magnitude, to obtain a deposition on the substrate of the material of the target to fill the groove and to provide a deposition with a substantially smooth surface of the deposition on the substrate at the positions of the groove and at the positions removed from the groove.

2. An apparatus as set forth in claim 1, including, the anode being at a positive voltage of approximately two hundred volts (+200 V.) and the target being at a negative potential of approximately three hundred volts (−300 V.).

3. An apparatus as set forth in claim 2, including, the third means including magnetic means providing a substantially constant magnetization for increasing the distance of movement of the electrons toward the target to enhance the ionization of the atoms of the inert gas in the cavity, the third means including the magnetic means being operative to enhance the ionization of the atoms of the inert gas in the cavity without obstructing the flow of the sputtered atoms from the target to the substrate.

4. An apparatus for providing a deposition on a planar substrate, including, a planar anode disposed in displaced and substantially parallel relationship to the substrate, a target spaced from the anode to serve as a cathode, the target having properties of emitting sputtered atoms when bombarded by gaseous ions and of directing the sputtered atoms to the substrate, the target having a hollow substantially frusto-conical configuration with an axis substantially perpendicular to the anode and the substrate, first means for defining a cavity between the anode and the target for receiving atoms of an inert gas, means for introducing the inert gas into the cavity, second means for applying a positive voltage to the anode and a negative voltage to the target relative to the positive voltage on the anode to establish a flow of electrons from the target toward the anode and a glow discharge between the target and the anode to ionize atoms of the inert gas in the cavity, and third means disposed relative to the anode and the target for providing a movement of the electrons between the target and the anode through other than a straight line path to enhance the ionization of the atoms of the inert gas and the emission of the sputtered atoms from the target for movement toward the substrate, the third means being at a potential lower than the positive voltage on the anode, the voltage between the anode and the target having a magnitude, and the positive voltage on the anode having a magnitude, to obtain depositions of the sputtered atoms from the target on the substrate with particular characteristics dependent upon the magnitude of the anode voltage and the difference between the anode voltage and the target voltage, the anode, the gas-introducing means, the first means, the second means and the third means being disposed relative to the target and the substrate to provide for the flow of the sputtered atoms from the target to the substrate without any obstruction, and there being in the substrate a groove defined by walls, the third means including magnetic means for providing a substantially constant magnetic field for increasing the distance of movement of the electrons toward the target to enhance the ionization of the atoms of the inert gas in the cavity, the third means including the magnetic means being operative to enhance the ionization of the atoms of the inert gas in the cavity without obstructing the flow of the sputtered atoms from the target to the substrate, the substrate being at a voltage lower than the positive voltage on the anode, the anode having a magnitude, and the difference between the voltages on the anode and the target having a magnitude, to obtain a deposition of a substantially uniform thickness of the sputtered atoms from the target on the surface of the substrate and on the walls of the groove in the substrate.

5. An apparatus as set forth in claim 4, including, the target being at a negative potential relative to the positive voltage on the anode, the substrate having at least one groove, the characteristics of the deposition on the substrate and in the groove being dependent upon the magnitude of the positive voltage on the anode and on the difference between the voltages on the anode and the target.

6. An apparatus as set forth in 5, including:

the groove having walls, a shield disposed between the anode and the substrate without obstructing the flow of sputtered atoms from the target to the substrate, there being a positive voltage on the anode with a magnitude, and there being a voltage difference between the anode and the target with a magnitude, to obtain a deposition on the substrate of the material of the target to fill the groove and to provide a deposition with a substantially smooth surface of the deposition on the substrate at the positions of the groove and at the positions removed from the groove, there being substantially ground potentials on the third means, the shield and the substrate.

7. An apparatus as set forth in claim 6 wherein there is a voltage difference of approximately five hundred volts between the anode and the target.

8. An apparatus as set forth in claim 4, including, the anode being at a positive voltage of approximately forty five volts (+45 V.) and the target being at a negative potential of approximately four hundred and fifty five volts (−455 V.).

9. An apparatus as set forth in claim 8, including, a shield disposed between the anode and the substrate without obstructing the flow of sputtered atoms from the target to the substrate and operative at a potential less than the positive voltage on the anode to receive charged particles moving toward the substrate.

10. In combination, a planar anode, a hollow target spaced from the anode to serve as a cathode, the hollow target having a hollow substantially frusto-conical shape with an axis substantially perpendicular to the anode, there being a cavity between the anode and the hollow target to receive molecules of a neutral gas, a planar substrate disposed in the cavity in substantially parallel relationship to the planar anode to receive atoms of the material emitted from the target and to provide a deposition of such atoms on the substrate, there being in the substrate a groove having walls, first means for introducing the neutral gas into the cavity, second means for applying a positive voltage to the anode and for applying to the target a voltage negative relative to the positive voltage on the anode to produce a flow of electrons from the target toward the anode and to establish a glow discharge between the target and the anode to ionize atoms of the neutral gas in the cavity, and third means for producing a substantially constant magnetic field between the anode and the target to provide for the movement of the electrons between the anode and the target in a convoluted path for ionizing molecules of the neutral gas in the cavity and to provide for an emission of sputtered atoms from the target for movement toward the substrate, the magnetic field means being at a voltage lower than the positive voltage on the anode, the voltages on the anode and the cathode having a difference, and the anode having a positive voltage, to produce an electrical field between the anode and the cathode to provide a deposition of the sputtered atoms on the substrate and on the walls of the groove in the substrate with particular characteristics of the deposition on the surface of the substrate relative to the characteristics of the deposition on the walls of the groove in the substrate, and the positive voltage on the anode having a magnitude dependent upon the characteristics of the deposition of the sputtered atoms on the substrate, the anode, the first means, the second means and the third means being disposed relative to the target and the substrate to provide for a flow of the sputtered atoms from the target to the substrate without obstruction, a shield disposed in the cavity between the target and the substrate and shaped to receive charged particles and prevent the charged particles from travelling to the substrate, the shield being disposed to prevent the charged particles from travelling to the substrate without obstructing the flow of the sputtered atoms from the target to the substrate, the shield being at a voltage less than the positive voltage on the anode, the characteristics of the deposition on the substrate and on the walls of the groove in the substrate being dependent upon the magnitude of the positive voltage on the anode and upon the difference between the voltages on the anode and the cathode, the third means being constructed and disposed to produce the substantially constant magnetic field in a direction substantially perpendicular to the electrical field between the anode and the cathode, and the substrate being at a voltage lower than the positive voltage on the anode, the magnitude of the positive voltage on the anode having a first value to provide a deposition with a substantially uniform thickness on the surface of the substrate and on the walls of the groove in the substrate and having a second value different from the first value to substantially fill the groove with the deposition and to provide the surface of the substrate and the filled groove with a deposition having a substantially smooth surface.

11. In combination, a planar anode, a hollow target spaced from the anode to serve as a cathode, the hollow target having a hollow substantially frusto-conical shape with an axis substantially perpendicular to the anode, there being a cavity between the anode and the hollow target to receive molecules of a neutral gas, a planar substrate disposed in the cavity in substantially parallel relationship to the planar anode to receive atoms of the material emitted from the target and to provide a deposition of such atoms on the substrate, there being in the substrate a groove having walls, first means for introducing the neutral gas into the cavity, second means for applying a positive voltage to the anode and for applying to the target a voltage negative relative to the positive voltage on the anode to produce a flow of electrons from the target toward the anode and to establish a glow discharge between the target and the anode to ionize atoms of the neutral gas in the cavity, and third means for producing a substantially constant magnetic field between the anode and the target to provide for the movement of the electrons between the anode and the target in a convoluted path for ionizing molecules of the neutral gas in the cavity and to provide for an emission of sputtered atoms from the target for movement toward the substrate, the magnetic field means being at a voltage lower than the positive voltage on the anode, the voltages on the anode and the cathode having a difference, and the anode having a positive voltage, to produce an electrical field between the anode and the cathode to provide a deposition of the sputtered atoms on the substrate and on the walls of the groove in the substrate with particular characteristics of the deposition on the surface of the substrate relative to the characteristics of the deposition on the walls of the groove in the substrate, and the positive voltage on the anode having a magnitude dependent upon the characteristics of the deposition of the sputtered atoms on the substrate, the anode, the first means, the second means and the third means being disposed relative to the target and the substrate to provide for a flow of the sputtered atoms from the target to the substrate without obstruction, and the glow discharge being at substantially the positive voltage of the anode and providing a deposition of the sputtered atoms from the target on the substrate with a substantially uniform thickness on the substrate and on the walls of the groove for a first voltage on the anode and a first voltage difference between the anode and the cathode and, for a second voltage on the anode and a second voltage difference between the anode and the cathode, providing a deposition substantially filling the groove and providing the surface of the substrate and the filled groove with a deposition having a substantially smooth surface.

12. An apparatus for providing a deposition of sputtered atoms on a planar substrate, including, a planar anode disposed in spaced and substantially parallel relationship to the substrate, a target displaced from the anode to define with the anode a cavity for receiving atoms of a neutral gas in the cavity, means for introducing the neutral gas into the cavity, means for providing a positive voltage on the anode to produce a flow of electrons from the target toward the anode and to establish a glow discharge between the target and the anode and to provide for an ionization by such electrons of atoms of the neutral gas in the cavity and an emission of sputtered atoms from the target to the substrate for a deposition of the sputtered atoms on the substrate, means for providing a negative voltage on the target relative to the positive voltage on the anode to attract the ions and obtain the emission from the target of sputtered atoms for movement toward the substrate, the voltages on the anode and the cathode creating an electrical field, means for creating a substantially constant magnetic field in the cavity in a direction substantially perpendicular to the electrical field between the anode and the target to create a force on the electrons for a movement of the electrons between the anode and the target through other than a straight line path and to enhance the ionization of the atoms of the neutral gas in the cavity, the magnetic field means being at a voltage less than the positive voltage on the anode, there being a voltage difference between the anode and the cathode of a magnitude, and the voltage on the anode having a magnitude, controlling the characteristics of the deposition of the sputtered atoms on the substrate, the target having a hollow substantially frusto-conical configuration with an axis substantially perpendicular to the anode and the anode being disposed relative to the hollow frusto-conical configuration of the target to provide for a flow of the sputtered atoms from the target to the substrate without obstruction, and a shield disposed in the cavity between the substrate and the target and having a voltage lower than the positive voltage on the anode and shaped and disposed to receive charged particles traveling toward the substrate, there being in the substrate a groove defined by walls, the voltage on the anode having a magnitude, and the voltage difference between the anode and the target having a magnitude, to provide the deposition of the sputtered atoms on the substrate with a substantially uniform thickness on the substrate and on the walls of the groove in the substrate.

13. An apparatus as set forth in claim 12, including, means for cooling the anode, the voltage on the anode having a second magnitude, and there being a second voltage difference between the anode and the target, to provide the deposition of the sputtered atoms on the substrate with characteristics filling the groove and providing a substantially smooth surface on the substrate and the filled groove of the substrate.

14. An apparatus for providing a deposition of sputtered atoms on a planar substrate, including, a planar anode disposed in spaced and substantially parallel relationship to the substrate, a target displaced from the anode to define with the anode a cavity for receiving atoms of a neutral gas in the cavity, means for introducing the neutral gas into the cavity, means for providing a positive voltage on the anode to produce a flow of electrons from the target toward the anode and to establish a glow discharge between the target and the anode and to provide for an ionization by such electrons of atoms of the neutral gas in the cavity and an emission of sputtered atoms from the target to the substrate for a deposition of the sputtered atoms on the substrate, means for providing a negative voltage on the target relative to the positive voltage on the anode to attract the ions and obtain the emission from the target of sputtered atoms for movement toward the substrate, the voltages on the anode and the cathode creating an electrical field, means for creating a substantially constant magnetic field in the cavity in a direction substantially perpendicular to the electrical field between the anode and the target to create a force on the electrons for a movement of the electrons between the anode and the target through other than a straight line path and to enhance the ionization of the atoms of the neutral gas in the cavity, the magnetic field means being at a voltage less than the positive voltage on the anode, there being a voltage difference between the anode and the cathode of a magnitude, and the voltage on the anode having a magnitude, controlling the characteristics of the deposition of the sputtered atoms on the substrate, the target having a hollow substantially frusto-conical configuration with an axis substantially perpendicular to the anode and the anode being disposed relative to the hollow frusto-conical configuration of the target to provide for a flow of the sputtered atoms from the target to the substrate without obstruction, and means for introducing the neutral gas into the cavity, the substrate being at a voltage lower than the voltage on the anode, the target being made from aluminum, and means for introducing oxygen into the cavity to convert the sputtered atoms of aluminum from the target to aluminum oxide and to obtain the deposition of the aluminum oxide on the substrate with an index of refraction of least approximately 1.63, the anode being at a positive voltage having a magnitude to obtain a deposition of the sputtered atoms of aluminum oxide with the index of refraction of at least approximately 1.63 at oxygen flow rates preventing any reduction in the voltage on the target with changes in the oxygen flow rates.

15. An apparatus as set forth in claim 14 wherein
the voltage on the anode has a positive value of approximately forty five volts (+45V.), and the voltage on the cathode has a negative voltage of approximately four hundred and fifty five volts (−455 V.), to obtain a deposition of the aluminum oxide on the substrate with an index of refraction of at least approximately 1.63.

16. An apparatus for providing a deposition of sputtered atoms,
a substrate having a planar configuration and having in the substrate at least one groove defined by walls,
a planar anode disposed in a spaced and substantially parallel relationship to the planar substrate,
a target displaced from the anode to define with the anode a cavity for receiving atoms of a neutral gas in the cavity, the target having a hollow substantially frusto-conical configuration with an axis substantially perpendicular to the anode and the substrate,
first means for introducing the atoms of the neutral gas into the cavity,
second means for providing a positive voltage on the anode to produce a movement of electrons from the target toward the anode and to cause the ionization by such electrons of atoms of the neutral gas in the cavity,
third means for providing a negative voltage on the target relative to the positive voltage on the anode to attract the ions and obtain the emission from the target of sputtered atoms for movement toward the substrate, the voltages on the anode and the target creating an electrical field for attracting the electrons toward the anode,
fourth means for providing a substantially constant magnetic field in a direction substantially perpendicular to the electric field for co-operating with the electrical field to increase the distance of travel of the electrons between the anode and the target and enhance the ionization of the atoms of the neutral gas in the cavity,
the positive voltage on the anode and the negative voltage on the target having values to control the thickness of the deposition and the characteristics of the deposition of the sputtered atoms on the substrate and on the walls in the groove in the substrate,
the anode and the first means, the second means, the third means and the fourth means being disposed relative to the target and the substrate to provide for the flow of the sputtered atoms from the target to the substrate without obstruction, and
the positive voltage on the anode and the negative voltage on the target relative to the positive voltage on the anode having values to produce a sputtered atom deposition of substantially uniform thickness on the walls of the groove in the substrate and on the substrate.

17. An apparatus as set forth in claim 16, including,
a shield disposed between the target and the substrate, the shield being shaped and provided with a voltage lower than the positive voltage on the anode to attract charged particles travelling toward the substrate,
the positive voltage on the anode producing substantially linear increases in the flow of sputtered atoms to the substrate with progressive increases in the positive voltage on the anode.

18. An apparatus for providing a deposition of sputtered atoms,
a substrate having a planar configuration and having in the substrate at least one groove defined by walls,
a planar anode disposed in a spaced and substantially parallel relationship to the planar substrate,
a target displaced from the anode to define with the anode a cavity for receiving atoms of a neutral gas in the cavity, the target having a hollow substantially frusto-conical configuration with an axis substantially perpendicular to the anode and the substrate,
first means for introducing the atoms of the neutral gas into the cavity,
second means for providing a positive voltage on the anode to produce a movement of electrons from the target toward the anode and to cause the ionization by such electrons of atoms of the neutral gas in the cavity,
third means for providing a negative voltage on the target relative to the positive voltage on the anode to attract the ions and obtain the emission from the target of sputtered atoms for movement toward the substrate, the voltages on the anode and the target creating an electrical field for attracting the electrons toward the anode,
fourth means for providing a substantially constant magnetic field in a direction substantially perpendicular to the electric field for co-operating with the electrical field to increase the distance of travel of the electrons between the anode and the target and enhance the ionization of the atoms of the neutral gas in the cavity,
the positive voltage on the anode and the negative voltage on the target having values to control the thickness of the deposition and the characteristics of the deposition of the sputtered atoms on the substrate and on the walls in the groove in the substrate,
the anode and the first means, the second means, the third means and the fourth means being disposed relative to the target and the substrate to provide for the flow of the sputtered atoms from the target to the substrate without obstruction, and
the positive voltage on the anode and the negative voltage on the target relative to the positive voltage on the anode having values to produce a sputtered atom deposition filling the groove and providing a substantially uniform thickness on the surface of the substrate and on the surface of the deposition in the filled groove.

19. An apparatus as set forth in claim 18, including,
a shield disposed between the target and the substrate, the shield being shaped and provided with a voltage lower than the positive voltage on the anode to attract charged particles travelling toward the substrate,
the positive voltage on the anode and the negative voltage on the target relative to the positive voltage on the anode having values to produce a sputtered atom deposition on the surface of the substrate, and on the walls of the groove, with a substantially uniform thickness.

20. An apparatus as set forth in claim 19 wherein
there are ground potentials on the fourth means, the shield and the substrate and
there is a difference of approximately five hundred volts (500 V.) between the anode and the target.

21. An apparatus for providing a deposition of sputtered atoms on a planar substrate having at least one groove defined by walls, including,
a planar anode disposed in a spaced and substantially parallel relationship to the substrate,
a target spaced from the anode to serve as a cathode, the target having properties of emitting sputtered atoms when bombarded by gaseous ions and of directing the sputtered atoms to the substrate, the target having a hollow substantially frusto-conical shape with an axis substantially perpendicular to the anode and the substrate, first means for defining a cavity between the anode and the target for receiving atoms of an inert gas, second means for introducing the inert gas into the cavity, third means for applying a positive voltage of a first magnitude on the anode to establish a glow discharge between the target and the anode and to provide for the ionization by such glow discharge of atoms of the inert gas in the cavity, fourth means for providing a negative voltage of a second magnitude on the target relative to the positive voltage on the anode, the relative voltages between the anode and the cathode creating an electrical field between the anode and the cathode, fifth means disposed relative to the anode and the target for creating a substantially constant magnetic field between the anode and the cathode in a direction substantially perpendicular to the electrical field for obtaining a movement of the ions toward the target in a path to obtain the emission of the sputtered atoms from the target for movement toward the substrate, the first magnitude of the positive voltage on the anode, and the difference between the positive voltage of the first magnitude and the negative voltage of the second magnitude, producing a deposition of the sputtered atoms in the groove of the substrate with characteristics dependent upon the first magnitude of the positive voltage on the anode and the difference between the positive voltage of the first magnitude and the negative voltage of the second magnitude respectively on the anode and the target, the anode and the first through fifth means being disposed relative to the target and the substrate to provide for a flow of the sputtered atoms from the target to the substrate without obstruction, and the first magnitude of the positive voltage on the anode and the difference between the positive voltage of the first magnitude and the negative voltage of the second magnitude respectively on the anode and the target providing for a deposition of the sputtered atoms with a substantially uniform thickness on the substrate and on the walls of the groove.

22. An apparatus for providing a deposition of sputtered atoms on a planar substrate having at least one groove defined by walls, including, a planar anode disposed in a spaced and substantially parallel relationship to the substrate, a target spaced from the anode to serve as a cathode, the target having properties of emitting sputtered atoms when bombarded by gaseous ions and of directing the sputtered atoms to the substrate, the target having a hollow substantially frusto-conical shape with an axis substantially perpendicular to the anode and the substrate, first means for defining a cavity between the anode and the target for receiving atoms of an inert gas, second means for introducing the inert gas into the cavity, third means for applying a positive voltage of a first magnitude on the anode to establish a glow discharge between the target and the anode and to provide for the ionization by such glow discharge of atoms of the inert gas in the cavity, fourth means for providing a negative voltage of a second magnitude on the target relative to the positive voltage on the anode, the relative voltages between the anode and the cathode creating an electrical field between the anode and the cathode, fifth means disposed relative to the anode and the target for creating a substantially constant magnetic field between the anode and the cathode in a direction substantially perpendicular to the electrical field for obtaining a movement of the ions toward the target in a path to obtain the emission of the sputtered atoms from the target for movement toward the substrate, the first magnitude of the positive voltage on the anode, and the difference between the positive voltage of the first magnitude and the negative voltage of the second magnitude, producing a deposition of the sputtered atoms in the groove of the substrate with characteristics dependent upon the first magnitude of the positive voltage on the anode and the difference between the positive voltage of the first magnitude and the negative voltage of the second magnitude respectively on the anode and the target, the anode and the first through fifth means being disposed relative to the target and the substrate to provide for a flow of the sputtered atoms from the target to the substrate without obstruction, the first magnitude of the positive voltage on the anode and the difference between the positive voltage of the first magnitude and the negative voltage of the second magnitude respectively on the anode and the target providing on the substrate a sputtered atom deposition substantially filling the groove in the substrate and providing a substantially smooth surface on the substrate and on the filled groove.

23. In a method of providing a deposition of sputtered atoms, the steps of:

providing a planar substrate with a groove in the substrate, the groove being defined by walls, the steps of:

providing a planar anode in a spaced and substantially parallel relationship to the substrate, providing a target in spaced relationship to the anode to define a cavity, the target having a hollow frusto-conical configuration with an axis substantially perpendicular to the planar anode and the planar substrate, providing a positive voltage on the anode and, on the target, a voltage negative relative to the positive voltage to establish an electrical field between the anode and the target and to establish a glow discharge between the anode and the target for the emission of electrons from the target and the movement of the electrons toward the anode, introducing atoms of a neutral gas into the cavity, providing a substantially constant magnetic field in a direction substantially perpendicular to the electrical field to facilitate the production of charged particles from the atoms of the neutral gas by the electrons and the movement of the charged particles toward the target for the sputtering of atoms from the target and the movement of the sputtered atoms toward the substrate, the positive voltage on the anode and the negative voltage on the target having a difference to obtain a deposition of the sputtered atoms on the substrate and a deposition on the walls of the groove in the substrate with particular characteristics, the sputtered atoms flowing from the target to the substrate without obstruction from the anode and the production of the magnetic field, and wherein the positive voltage on the anode and the negative voltage on the target have values to provide a deposition of the sputtered atoms with a substantially uniform thickness on the substrate and on the walls of the groove in the substrate.

24. In a method of providing a deposition of sputtered atoms, the steps of:

providing a planar substrate with a groove in the substrate, the groove being defined by walls, the steps of:

providing a planar anode in a spaced and substantially parallel relationship to the substrate, providing a target in spaced relationship to the anode to define a cavity, the target having a hollow frusto-conical configuration with an axis substantially perpendicular to the planar anode and the planar substrate, providing a positive voltage on the anode and, on the target, a voltage negative relative to the positive voltage to establish an electrical field between the anode and the target and to establish a glow discharge between the anode and the target for the emission of electrons from the target and the movement of the electrons toward the anode, introducing atoms of a neutral gas into the cavity, providing a substantially constant magnetic field in a direction substantially perpendicular to the electrical field to facilitate the production of charged particles from the atoms of the neutral gas by the electrons and the movement of the charged particles toward the target for the sputtering of atoms from the target and the movement of the sputtered atoms toward the substrate, the positive voltage on the anode and the negative voltage on the target having a difference to obtain a deposition of the sputtered atoms on the substrate and a deposition on the walls of the groove in the substrate with particular characteristics, the sputtered atoms flowing from the target to the substrate without obstruction from the anode and the production of the magnetic field, and wherein the positive voltage on the anode and the negative voltage on the target have values to provide a substantial filling of the groove of the substrate with the sputtered atoms and to provide the deposition of the sputtered atoms with a substantially planar surface on the substrate including the filled groove.

25. In a method of providing a deposition of sputtered atoms, the steps of:

providing a planar substrate with a groove in the substrate, the groove being defined by walls, the steps of:

providing a planar anode in a spaced and substantially parallel relationship to the substrate, providing a target in spaced relationship to the anode to define a cavity, the target having a hollow frusto-conical configuration with an axis substantially perpendicular to the planar anode and the planar substrate, providing a positive voltage on the anode and, on the target, a voltage negative relative to the positive voltage to establish an electrical field between the anode and the target and to establish a glow discharge between the anode and the target for the emission of electrons from the target and the movement of the electrons toward the anode, introducing atoms of a neutral gas into the cavity, providing a substantially constant magnetic field in a direction substantially perpendicular to the electrical field to facilitate the production of charged particles from the atoms of the neutral gas by the electrons and the movement of the charged particles toward the target for the sputtering of atoms from the target and the movement of the sputtered atoms toward the substrate, the positive voltage on the anode and the negative voltage on the target having a difference to obtain a deposition of the sputtered atoms on the substrate and a deposition on the walls of the groove in the substrate with particular characteristics, the sputtered atoms flowing from the target to the substrate without obstruction from the anode and the production of the magnetic field, and wherein the anode and the target are respectively provided with voltages with a substantially constant difference in magnitude and the positive voltage on the anode has a first value to provide a substantially uniform thickness of the deposition of the sputtered atoms on the substrate and on the walls of the groove and a second value to provide a substantial filling of the groove in the deposition with the sputtered atoms and a substantially smooth surface of the deposition on the substrate and on the filled groove.

26. In a method as set forth in claim 25 wherein a shield is disposed between the target and the substrate and is provided with a shape and a voltage lower than the positive voltage on the anode to attract charged particles travelling toward the substrate and wherein the sputtered atoms flow from the target to the substrate without obstruction from the shield.

27. In a method as set forth in claim 26 wherein the substantially constant magnetic field is provided by a plurality of members and wherein the members forming the magnetic field are at a voltage lower than the positive voltage on the anode and wherein the anode is water cooled and wherein the sputtered atoms flow from the target to the substrate without obstruction from the members forming the magnetic field.

28. In a method as set forth in claim 25 wherein a shield is disposed between the target and the substrate and is shaped to attract charged particles traveling toward the substrate and wherein the shield, the substrate and the fourth means are at substantially ground potentials.

29. In a method of providing a deposition of sputtered atoms, the steps of:

providing a planar substrate with a groove in the substrate, the groove being defined by walls, the steps of:

providing a planar anode in a spaced and substantially parallel relationship to the substrate, providing a target in spaced relationship to the anode to define a cavity, the target having a hollow frusto-conical configuration with an axis substantially perpendicular to the planar anode and the planar substrate, providing a positive voltage on the anode and, on the target, a voltage negative relative to the positive voltage to establish an electrical field between the anode and the target and to establish a glow discharge between the anode and the target for the emission of electrons from the target and the movement of the electrons toward the anode, introducing atoms of a neutral gas into the cavity, providing a substantially constant magnetic field in a direction substantially perpendicular to the electrical field to facilitate the production of charged particles from the atoms of the neutral gas by the electrons and the movement of the charged particles toward the target for the sputtering of atoms from the target and the movement of the sputtered atoms toward the substrate, the positive voltage on the anode and the negative voltage on the target having a difference to obtain a deposition of the sputtered atoms on the substrate and a deposition on the walls of the groove in the substrate with particular characteristics, the sputtered atoms flowing from the target to the substrate without obstruction from the anode and the production of the magnetic field, and wherein the anode is provided with a positive voltage of approximately forty five volts (45V.) and the target is provided with a negative voltage of approximately four hundred and fifty five volts (−455V.) to produce a deposition of the sputtered atoms with a substantially uniform thickness on the substrate and on the walls of the groove in the substrate.

30. In a method of providing a deposition of sputtered atoms, the steps of:

providing a planar substrate with a groove in the substrate, the groove being defined by walls, the steps of:

providing a planar anode in a spaced and substantially parallel relationship to the substrate, providing a target in spaced relationship to the anode to define a cavity, the target having a hollow frusto-conical configuration with an axis substantially perpendicular to the planar anode and the planar substrate, providing a positive voltage on the anode and, on the target, a voltage negative relative to the positive voltage to establish an electrical field between the anode and the target and to establish a glow discharge between the anode and the target for the emission of electrons from the target and the movement of the electrons toward the anode, introducing atoms of a neutral gas into the cavity, providing a substantially constant magnetic field in a direction substantially perpendicular to the electrical field to facilitate the production of charged particles from the atoms of the neutral gas by the electrons and the movement of the charged particles toward the target for the sputtering of atoms from the target and the movement of the sputtered atoms toward the substrate, the positive voltage on the anode and the negative voltage on the target having a difference to obtain a deposition of the sputtered atoms on the substrate and a deposition on the walls of the groove in the substrate with particular characteristics, the sputtered atoms flowing from the target to the substrate without obstruction from the anode and the production of the magnetic field, and wherein the anode is provided with a positive voltage of approximately two hundred volts (200V.) and the target is provided with a negative voltage of approximately three hundred volts (−300 V.) to substantially fill the groove with the deposition of the sputtered atoms and provide a substantially smooth surface of the sputtered atoms on the substrate including the filled groove.

31. An apparatus for providing a deposition of molecules of aluminum oxide on the surface of a planar substrate, including, a planar anode displaced from the substrate and disposed substantially parallel to the substrate, a target spaced from the anode and defining a cathode, the target being made from aluminum, the target being hollow and having a substantially frusto-conical inner periphery substantially perpendicular to the anode and the target, first means associated with the anode and the cavity for defining a cavity, second means for introducing a neutral gas into the cavity, third means for providing a positive voltage on the anode and a negative voltage on the target relative to the positive voltage on the anode to establish an electrical field between the anode and the target and to establish a glow discharge between the anode and the target and to obtain an emission of electrons from the target and a movement of such electrons toward the anode, fourth means for producing a substantially constant magnetic field in co-operation with the electrical field and substantially perpendicular to the electrical field to obtain a force on the electrons for enhancing the movement of the electrons between the target and the anode and to facilitate an ionization by the electrons of the atoms of the neutral gas in the cavity and an emission of sputtered atoms of aluminum from the surface of the target toward the surface of the substrate, and fifth means for introducing a flow of oxygen into the cavity for chemical reaction with the atoms of aluminum to produce molecules of aluminum oxide for deposition on the surface of the substrate, the positive voltage on the anode having a first magnitude and the negative voltage on the target having a second magnitude relative to the positive voltage on the anode to provide for a deposition of the aluminum oxide on the substrate with an index of refraction of at least approximately 1.63, the index of refraction being provided at an oxygen flow rate maintaining, with changes in the oxygen flow rate, the index of refraction of the aluminum oxide deposited on the substrate at a value of at least approximately 1.63 and preventing any decrease in the magnitude of the voltage on the target.

32. An apparatus as set forth in claim 31, including, the fifth means providing for a flow of oxygen, even at variable flow rates of oxygen, into the cavity to provide a deposition of the aluminum oxide on the surface of the substrate with an index of refraction variable between at least approximately 1.63 and approximately 1.70 even at such variable flow rates.

33. An apparatus as set forth in claim 32 wherein the anode is substantially parallel to the substrate and the target has a hollow substantially frusto-conical shape with an axis perpendicular to the anode and wherein the anode and the first, second, third, fourth and fifth means are disposed relative to the target and the substrate to provide for the flow of the sputtered atoms from the target to the substrate without obstruction.

34. An apparatus as set forth in claim 32 wherein
the anode is at a positive value of approximately forty five volts (+45 V.) and the target is at a negative voltage of approximately four hundred and fifty five volts (−455 V.).

35. An apparatus as set forth in claim 31, including,
the fifth means providing an oxygen flow rate which can be varied without substantially changing the magnitude of the voltage on the target while maintaining the index of refraction of the aluminum oxide deposited on the substrate within a range of at least approximately 1.63 to approximately 1.70 with such variable flow rates.

36. An apparatus as set forth in claim 31, including,
the substrate being at a voltage lower than the positive voltage on the anode,
the third means providing a progressively increased rate of deposition of the aluminum oxide on the substrate for progressively increased values of the voltage on the anode relative to the voltage on the substrate.

37. An apparatus as set forth in claim 36, including,
the fifth means providing for a controlled flow of oxygen into the cavity at a rate variable to provide a deposition of the aluminum oxide on the surface of the substrate with an index of refraction variable between at least approximately 1.63 and approximately 1.70 in accordance with such variation in the flow rate,
the fifth means providing a particular oxygen flow rate which can be varied above and below such particular flow rate without substantially changing the magnitude of the negative volume on the target while maintaining the index of refraction of the aluminum oxide deposited on the substrate within a range of at, least approximately 1.63 to approximately 1.70 with such variable flow rate.

38. An apparatus as set forth in claim 37 wherein
the anode is substantially parallel to the substrate and the target has a hollow substantially frusto-conical shape with an axis substantially perpendicular to the anode and wherein the anode and the first, second, third and fourth means are disposed relative to the target and the substrate to provide for the flow of the sputtered atoms from the target toward the substrate without obstruction and to provide for the flow of the metallic oxide to the substrate without obstruction.

39. An apparatus as set forth in claim 31 wherein
a shield is disposed between the target and the substrate and is shaped to attract charged particles traveling toward the substrate and wherein
the fourth means are provided at a substantially ground potential and wherein
the shield and the substrate are at substantially ground potentials.

40. An apparatus for providing a deposition of molecules of a metallic oxide on the surface of a planar substrate, including,
a planar anode displaced from the planar substrate and substantially parallel to the planar substrate,
a target displaced from the anode to define with the anode a cavity for receiving atoms of a neutral gas in the cavity, the target being.made from a metal, the target having a frusto-conical inner periphery substantially perpendicular to the planar anode and
first means for introducing the atoms of the neutral gas into the cavity,
second means for providing a positive voltage on the anode and a negative voltage on the cathode relative to the positive voltage on the anode to establish a glow discharge to obtain the emission of electrons from the target and the ionization by such electrons of atoms of the neutral gas in the cavity and the emission of sputtered atoms from the target as a result of the ionization of the neutral gas,
third means for producing a substantially constant magnetic field in the cavity in a direction substantially perpendicular to the electrical field between the anode and the target to produce a force on the electrons for increasing the distance of travel of the electrons between the anode and the target and for enhancing the ionization of the atoms of the neutral gas in the cavity, and
fourth means for providing for a flow of oxygen in the cavity for chemical reaction with the sputtered atoms of the metal emitted from the target and the deposition of molecules of the metallic oxide on the substrate,
the magnitude of the positive voltage on the anode providing, in cooperation with progressive increases in the flow rate of the oxygen into the cavity, for the production of the metallic oxide for deposition on the substrate in a range of progressive indices of refraction.

41. An apparatus as set forth in claim 40, including,
the metal being aluminum and the metallic oxide being aluminum oxide and the variable indices of refraction being between at least approximately 1.63 and approximately 1.70.

42. An apparatus as set forth in claim 41 wherein
the voltage on the anode has a positive value of approximately forty five volts (+45 V.) and the target has a negative value of approximately four hundred and fifty five volts (−455 V.).

43. An apparatus as set forth in claim 40, including,
the fourth means providing a particular flow rate of oxygen where the negative voltage on the target remains substantially constant through a range of oxygen flow rates above and below the particular flow rate while maintaining the index of refraction of the metallic oxide in the range of the progressive indices of refraction with progressive increases in the oxygen flow rate.

44. An apparatus as set forth in claim 43, including,
the third means being at a voltage lower than the positive voltage on the anode, and
sixth means for cooling the third means and the anode.

45. In a combination as set forth in claim 44,
a shield disposed between the target and the substrate and shaped and provided with a voltage lower than the positive voltage on the anode to inhibit the movement of charged particles to the substrate,
the metal in the target being aluminum and the metallic oxide deposited on the substrate being an oxide of aluminum and the particular-range of the indices of refraction of the aluminum oxide deposited on the substrate being between at least approximately 1.63 and approximately 1.70.

46. An apparatus as set forth in claim 45, including,
the anode being substantially parallel to the substrate and the target having a hollow substantially frusto-conical shape with an axis substantially perpendicular to the anode and wherein the anode and the first, second, third and fourth means are disposed relative to the target and the substrate to provide for the flow of the sputtered atoms from the target toward the substrate without obstruction and to provide for the flow of the metallic oxide to the substrate without obstruction.

47. An apparatus as set forth in claim 44, including,
a shield disposed between the target and the substrate, the shield being shaped and provided with a voltage lower than the positive voltage on the anode to inhibit the movement of charged particles to the substrate,
the voltage on the anode having a positive value of approximately forty five volts (+45 V.) and the target having a negative value of approximately four hundred and fifty five volts (−455 V.).

48. An apparatus as set forth in claim 43, including,
a shield disposed between the target and the substrate, the shield being shaped and provided with a voltage lower than the positive voltage on the anode to inhibit the movement of charged particles to the substrate.

49. In a method of depositing a metallic oxide on the surface of a planar substrate, the steps of:
disposing a planar anode and a target in a relationship to define a cavity with the anode being substantially parallel to the substrate and displaced from the substrate and with the target having a substantially frusto-conical inner periphery with an axis substantially perpendicular to the planar substrate and the planar anode,
the target being made from a metallic element,
introducing atoms of a neutral gas into the cavity,
providing an electrical field between the anode and the target to establish a glow discharge for the production of a flow of electrons from the target to the anode and an ionization of the atoms of the neutral gas in the cavity by the electrons and a movement of the ions toward the target to obtain an emission of atoms of the metallic element from the target and a movement of such atoms toward the substrate,
providing a substantially constant magnetic field in the cavity in a direction relative to the electrical field for producing a force on the electrons in a direction to enhance the ionization of the atoms of the neutral gas by the electrons,
providing a flow of oxygen into the cavity to obtain a chemical combination of the molecules of the metallic element and the oxygen to form molecules of the metallic oxide for deposition on the substrate,
providing a positive voltage on the anode and a negative voltage on the substrate relative to the positive voltage on the anode to obtain a deposition of the metallic oxide on the substrate with at least a particular index of refraction through a particular range of oxygen flow rates, and
regulating the oxygen flow rate at an intermediate value in the particular range of oxygen flow rates.

50. In a method as set forth in claim 49,
wherein the target is made from aluminum and the metallic oxide is aluminum oxide and the particular index of refraction is at least approximately 1.63.

51. In a method, as set forth in claim 50 wherein
the aluminum oxide is provided with a particular index of refraction within the range of at least approximately 1.63 to approximately 1.70 in accordance with the flow of the oxygen into the cavity at different rates within the particular range.

52. A method as set forth in claim 50 wherein
the anode has a positive value of approximately forty five volts (+45 V.) and the target has a negative value of approximately four hundred and fifty five volts (−455 V.).

53. In a method as set forth in claim 49 wherein
the voltage on the target is maintained at a substantially constant negative value while the oxygen flow rate is varied to any value within the particular range to maintain at least the particular index of refraction for the metallic oxide on the substrate.

54. In a method as set forth in claim 53 wherein
the aluminum oxide is provided with a particular index of refraction within the range of at least approximately 1.63 and wherein,
the anode has a positive value of approximately forty five volts (+45 V.) and wherein
the target has a negative potential of approximately four hundred and fifty five volts (−455 V.) and wherein
the anode is substantially parallel to the substrate and the target has a hollow substantially frusto-conical shape with an axis substantially perpendicular to the anode and wherein
the sputtered atoms flow toward the substrate without obstruction from the anode and wherein the aluminum oxide flows toward the substrate without obstruction from the anode.

55. In a method as set forth in claim 53 wherein
the target is made from aluminum.and the metallic oxide is aluminum oxide and the particular index of refraction is at least approximately 1.63 and wherein
the anode has a positive potential of approximately forty five volts (+45 V.) and the target has a negative potential of approximately four hundred and fifty five volts (−455 V.).

56. In a method as set forth in claim 53 wherein
a shield is disposed between the target and the substrate and is shaped to attract charged particles travelling toward the substrate and wherein
the magnetic field is provided at a substantially constant ground potential and wherein
the substrate and the shield are at substantially ground potentials.

57. In a method of depositing atoms of a particular material, the steps of:
providing a planar substrate,
disposing a planar anode and a target in a particular relationship to define a cavity with the planar anode substantially parallel to the planar substrate and displaced from the substrate and with the target having a substantially frusto-conical inner periphery and with the axis of the frusto-conical periphery being substantially perpendicular to the planar anode and the planar substrate,
introducing atoms of a neutral gas into the cavity,
providing an electrical field between the anode and the target to establish a glow discharge for the production of a flow of electrons from the target to the anode and an ionization by the electrons of the atoms of the neutral gas in the cavity and a movement of the ions toward the target to obtain an emission of atoms from the target and a movement of such atoms toward the substrate,
providing a substantially constant magnetic field in the cavity in a direction relative to the electrical field for producing a force on the electrons in a direction to enhance the ionization of the atoms of the neutral gas by the electrons, and
providing a positive voltage on the anode and a voltage on the substrate lower than the positive voltage on the anode, and varying the positive voltage on the anode, while maintaining the voltage on the substrate substantially constant, to produce variations in the rate of the deposition of the sputtered atoms on the substrate in accordance with such voltage variations, and with the voltage on the substrate substantially constant at the value lower than the voltage on the anode, the relationship between the variations in the positive voltage on the anode and the rate of the deposition of the sputtered atoms on the substrate being substantially linear.

58. In a method as set forth in claim 57, the substantially linear relationship continuing through a range of at least sixty volts (60V.) on the anode.

59. In a method as set forth in claim 58, the substrate being at a ground potential.

60. An apparatus for providing a deposition on a planar substrate, including, a planar anode disposed in substantially parallel relationship to the substrate, a target displaced from the anode to define with the anode a cavity for receiving atoms of a neutral gas in the cavity, the target having a hollow substantially frusto-conical configuration with an axis substantially perpendicular to the anode, first means for introducing atoms of the neutral gas into the cavity, second means for providing a positive potential on the anode to establish a glow discharge and an ionization by such glow discharge of atoms of the neutral gas in the cavity, third means for providing a negative potential on the target relative to the positive potential on the anode to attract the ions and obtain the emission from the target of sputtered atoms for movement toward the substrate, and fourth means for producing a substantially constant magnetic field in the cavity in a direction substantially perpendicular to the electrical field between the anode and the target to produce a force on the electrons for producing a movement of the electrons between the anode and the target other than in a straight line path and for enhancing the ionization of the atoms of the neutral gas in the cavity as a result of such movement, the target being at a fixed potential, and the positive voltage on the anode being variable to vary the rate of deposition of the sputtered atoms from the target on the substrate in accordance with such voltage variations, the anode, the first means, the second means, the third means and the fourth means being disposed relative to the target and the substrate to provide for a flow of the sputtered atoms from the target to the substrate without obstruction, and the substrate being at a voltage lower than the positive voltage on the anode, there being a substantially linear relationship between the voltage on the anode and the rate of deposition of the sputtered atoms on the substrate with the substantially constant voltage on the substrate at the value lower than the positive voltage on the anode.

61. In a combination as set forth in claim 60, the substantially linear relationship between the voltage on the anode and the rate of deposition of the sputtered atoms from the target on the substrate extending to a value of at least sixty volts (6V.) on the anode.

62. An apparatus for providing a deposition of sputtered atoms on a planar substrate, including, a planar anode disposed in spaced and substantially parallel relationship to the substrate, a target displaced from the anode to define with the anode a cavity for receiving atoms of a neutral gas in the cavity, means for introducing the neutral gas into the cavity, means for providing a positive voltage on the anode to produce a flow of electrons from the target toward the anode and to establish a glow discharge between the target and the anode and to provide for an ionization by such electrons of atoms of the neutral gas in the cavity and an emission of sputtered atoms from the target to the substrate for a deposition of the sputtered atoms on the substrate, means for providing a negative voltage on the target relative to the positive voltage on the anode to attract the ions and obtain the emission from the target of sputtered atoms for movement toward the substrate, the voltages on the anode and the cathode creating an electrical field, means for creating a substantially constant magnetic field in the cavity in a direction substantially perpendicular to the electrical field between the anode and the target to create a force on the electrons for a movement of the electrons between the anode and the target through other than a straight line path and to enhance the ionization of the atoms of the neutral gas in the cavity, the magnetic field means being at a voltage less than the positive voltage on the anode, there being a voltage difference between the anode and the cathode of a magnitude, and the voltage on the anode having a magnitude, controlling the characteristics of the deposition of the sputtered atoms on the substrate, the target having a hollow substantially frusto-conical configuration with an axis substantially perpendicular to the anode and the anode being disposed relative to the hollow frusto-conical configuration of the target to provide for a flow of the sputtered atoms from the target to the substrate without obstruction, and the voltage on the anode being at a positive value of approximately forty five volts (+45V.), and the voltage difference between the anode and the target being approximately five hundred volts (500 V.), to provide the deposition of the sputtered atoms on the substrate with characteristics filling the groove and providing a substantially smooth surface on the substrate and on the filled groove of the substrate.

63. An apparatus for providing a deposition of sputtered atoms on a planar substrate, including, a planar anode disposed in spaced and substantially parallel relationship to the substrate, a target displaced from the anode to define with the anode a cavity for receiving atoms of a neutral gas in the cavity, means for introducing the neutral gas into the cavity, means for providing a positive voltage on the anode to produce a flow of electrons from the target toward the anode and to establish a glow discharge between the target and the anode and to provide for an ionization by such electrons of atoms of the neutral gas in the cavity and an emission of sputtered atoms from the target to the substrate for a deposition of the sputtered atoms on the substrate, means for providing a negative voltage on the target relative to the positive voltage on the anode to attract the ions and obtain the emission from the target of sputtered atoms for movement toward the substrate, the voltages on the anode and the cathode creating an electrical field, means for creating a substantially constant magnetic field in the cavity in a direction substantially perpendicular to the electrical field between the anode and the target to create a force on the electrons for a movement of the electrons between the anode and the target through other than a straight line path and to enhance the ionization of the atoms of the neutral gas in the cavity, the magnetic field means being at a voltage less than the positive voltage on the anode, there being a voltage difference between the anode and the cathode of a magnitude, and the voltage on the anode having a magnitude, controlling the characteristics of the deposition of the sputtered atoms on the substrate, the target having a hollow substantially frusto-conical configuration with an axis substantially perpendicular to the anode and the anode being disposed relative to the hollow frusto-conical configuration of the target to provide for a flow of the sputtered atoms from the target to the substrate without obstruction, and the voltage on the anode being at a positive value of approximately two hundred volts (+200V.) and the voltage difference between the anode and the target being approximately five hundred volts (500 V.), to provide a deposition of a substantially uniform thickness on the substrate and on the walls of the groove in the substrate.

* * * * *